United States Patent
Ishizaka (10) Patent No.: US 7,338,901 B2
(45) Date of Patent: Mar. 4, 2008

(54) METHOD OF PREPARING A FILM LAYER-BY-LAYER USING PLASMA ENHANCED ATOMIC LAYER DEPOSITION

(75) Inventor: Tadahiro Ishizaka, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 251 days.

(21) Appl. No.: 11/206,994

(22) Filed: Aug. 19, 2005

(65) Prior Publication Data

US 2007/0042577 A1 Feb. 22, 2007

(51) Int. Cl.
*H01L 21/44* (2006.01)

(52) U.S. Cl. ............... 438/680; 438/685; 257/E21.161; 257/E21.17

(58) Field of Classification Search ................ 438/680, 438/685; 257/E21.161, E21.17
See application file for complete search history.

(56) References Cited

U.S. PATENT DOCUMENTS

| 7,022,605 B2* | 4/2006 | Doan et al. .................. 438/680 |
| 2004/0038525 A1* | 2/2004 | Meng et al. ................ 438/656 |
| 2004/0224504 A1* | 11/2004 | Gadgil ........................ 438/680 |
| 2004/0231799 A1* | 11/2004 | Lee et al. .............. 156/345.34 |
| 2006/0211246 A1* | 9/2006 | Ishizaka et al. ............. 438/685 |

* cited by examiner

*Primary Examiner*—Trung Dang
(74) *Attorney, Agent, or Firm*—Oblon, Spivak, McClelland, Maier & Neustadt, P.C.

(57) ABSTRACT

A method for forming a thin film on a substrate layer by layer using plasma enhanced atomic layer deposition is described. The method comprises using a low power reduction step for at least one cycle in order to substantially avoid partial layer film growth, followed by using a high power reduction step for each cycle thereafter in order to increase deposition rate.

26 Claims, 10 Drawing Sheets

METHOD OF PREPARING A FILM LAYER-BY-LAYER USING PLASMA ENHANCED ATOMIC LAYER DEPOSITION

BACKGROUND OF THE INVENTION

1. Field of the Invention

The present invention relates to a plasma enhanced atomic layer deposition system and a method of operating thereof, and more particularly to a method of preparing a film layer by layer.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine trenches or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of CVD or more generally film deposition, has emerged as a candidate for ultra-thin gate film formation in front end-of-line (FEOL) operations, as well as ultra-thin barrier layer and seed layer formation for metallization in back end-of-line (BEOL) operations. In ALD, two or more process gasses are introduced alternatingly and sequentially in order to form a material film one monolayer at a time. Such an ALD process has proven to provide improved uniformity and control in layer thickness, as well as conformality to features on which the layer is deposited. However, current ALD processes can produce films with poor barrier properties despite their superior conformality. Further, current ALD processes may be time consuming, which reduces device manufacturing throughput.

SUMMARY OF THE INVENTION

Accordingly, one object of the present invention is directed to addressing any of the above-described and/or other problems with ALD systems and processes.

Another object of the present invention is to improve the barrier properties of ALD films.

Still another object of the invention is to provide improved ALD films at a higher manufacturing throughput.

These and/or other objects of the present invention may be provided by a method of depositing a thin film on a substrate using a plasma enhanced atomic layer deposition (PEALD) system process, comprising: disposing the substrate in a processing chamber configured to facilitate the PEALD process; performing a first set of PEALD process cycles by setting an electromagnetic power to a low power condition in order to facilitate layer-by-layer growth of the thin film during the early stages of film growth; and performing a second set of PEALD process cycles by setting an electromagnetic power to a high power condition in order to facilitate layer-by-layer growth of the thin film and accelerate film growth, wherein each PEALD process cycle comprises: introducing a first process material within the processing chamber; introducing a second process material within the processing chamber; and coupling electromagnetic power according to a power condition to the processing chamber during introduction of the second process material. For example, the low power condition can correspond to an electromagnetic power less than approximately 1000 W, and the high power condition can correspond to an electromagnetic power greater than approximately 1000 W.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
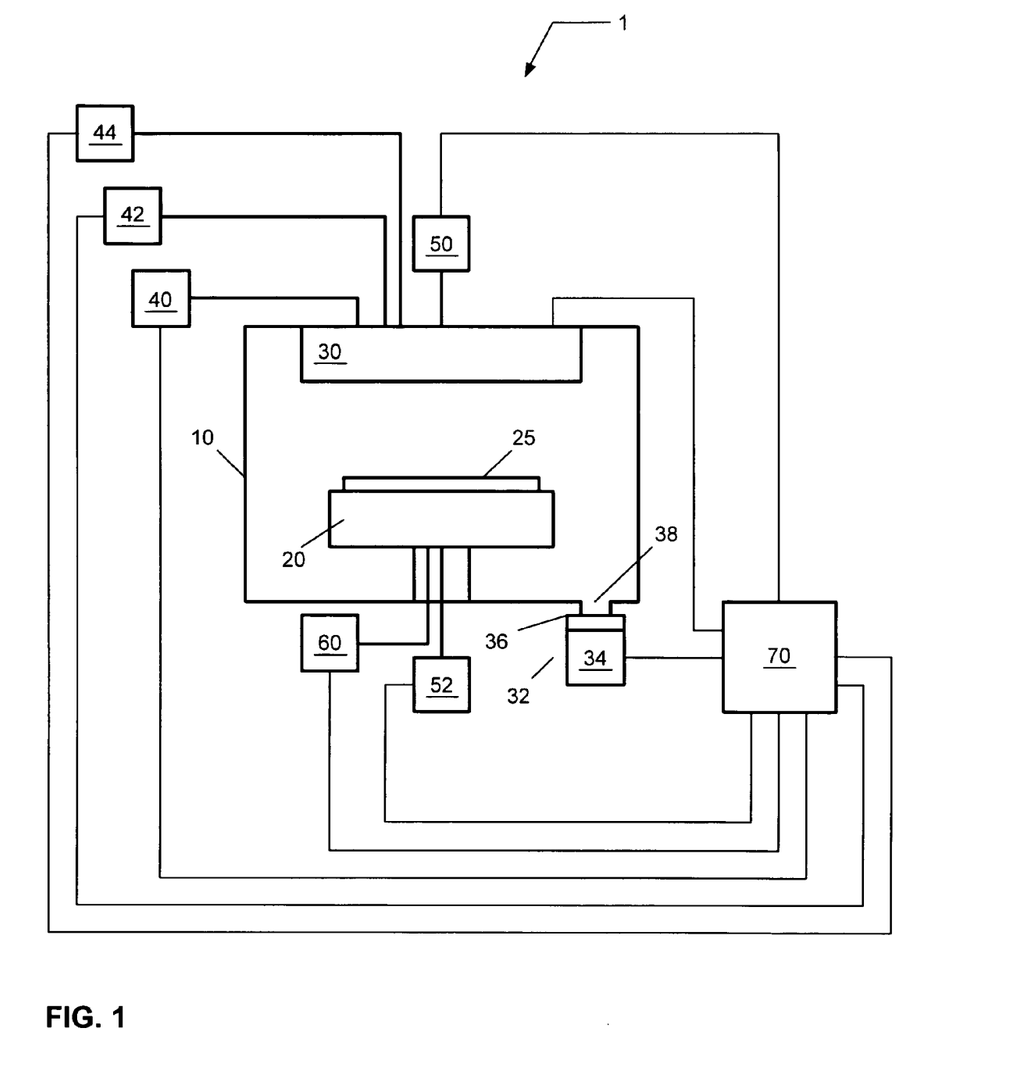
FIG. 1 depicts a schematic view of a deposition system.

Referring now to the drawings, wherein like reference numerals designate identical or corresponding parts throughout the several views, FIG. 1 illustrates a deposition system 1 for depositing a thin film on a substrate according to one embodiment. For example, during the metallization of inter-connect and intra-connect structures for semiconductor devices in back-end-of-line (BEOL) operations, a thin conformal barrier layer may be deposited on wiring trenches or vias to minimize the migration of metal into the inter-level or intra-level dielectric.

The deposition system 1 comprises a process chamber 10 having a substrate holder 20 configured to support a substrate 25, upon which the thin film is formed. The process chamber 10 further comprises an upper assembly 30 coupled to a first process material supply system 40, a second process material supply system 42, and a purge gas supply system 44. Additionally, the deposition system 1 comprises a first power source 50 coupled to the process chamber 10 and configured to generate plasma in the process chamber 10, and a substrate temperature control system 60 coupled to substrate holder 20 and configured to elevate and control the temperature of substrate 25. Additionally, deposition system 1 comprises a controller 70 that can be coupled to process chamber 10, substrate holder 20, upper assembly 30, first process material supply system 40, second process material supply system 42, purge gas supply system 44, first power source 50, and substrate temperature control system 60.

Alternately, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The deposition system 1 can comprise any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Referring still to FIG. 1, the deposition system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternatingly introduce a first process material to process chamber 10 and a second process material to process chamber 10. The alternation of the introduction of the first material and the introduction of the second material can be cyclical, or it may be acyclical with variable time periods between introduction of the first and second materials. The first process material can, for example, comprise a film precursor, such as a composition having the principal atomic or molecular species found in the film formed on substrate 25. For instance, the film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a Noble gas (i.e., helium, neon, argon, xenon, krypton), or nitrogen, or hydrogen.

Referring still to FIG. 1, the deposition system 1 comprises a plasma generation system configured to generate a plasma during at least a portion of the alternating introduction of the first process material and the second process material to process chamber 10. The plasma generation system can include a first power source 50 coupled to the process chamber 10, and configured to couple power to the first process material, or the second process material, or both in process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in plasma process chamber 10 by reducing the reflected power. Match network topologies (e.g. L-type, π-type, T-type, etc.) and automatic control methods are well known to those skilled in the art.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorpo Optionally, the deposition system 1 comprises a substrate bias generation system configured to generate or assist in generating a plasma during at least a portion of the alternating introduction of the first process material and the second process material to process chamber 10. The substrate bias system can include a substrate power source 52 coupled to the process chamber 10, and configured to couple power to substrate 25. The substrate power source 52 may include a radio frequency (RF) generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternately, RF power is applied to the substrate holder electrode at multiple frequencies.

Although the plasma generation system and the optional substrate bias system are illustrated in FIG. 1 as separate entities, they may indeed comprise one or more power sources coupled to substrate holder 20.

Still referring to FIG. 1, deposition system 1 comprises substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the processing chamber 10 and any other component within the deposition system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials.

The vacuum pumping systems 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etch, a 300 to 5000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Still referring to FIG. 1, controller 70 can comprise a microprocessor, memory, and a digital I/O port capable of generating control voltages sufficient to communicate and activate inputs to deposition system 1 as well as monitor outputs from deposition system 1. Moreover, the controller 70 may be coupled to and may exchange information with the process chamber 10, substrate holder 20, upper assembly 30, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 according to a process recipe in order to perform an etching process, or a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the deposition system 1, or it may be remotely located relative to the deposition system 1. For example, the controller 70 may exchange data with the deposition system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 2:
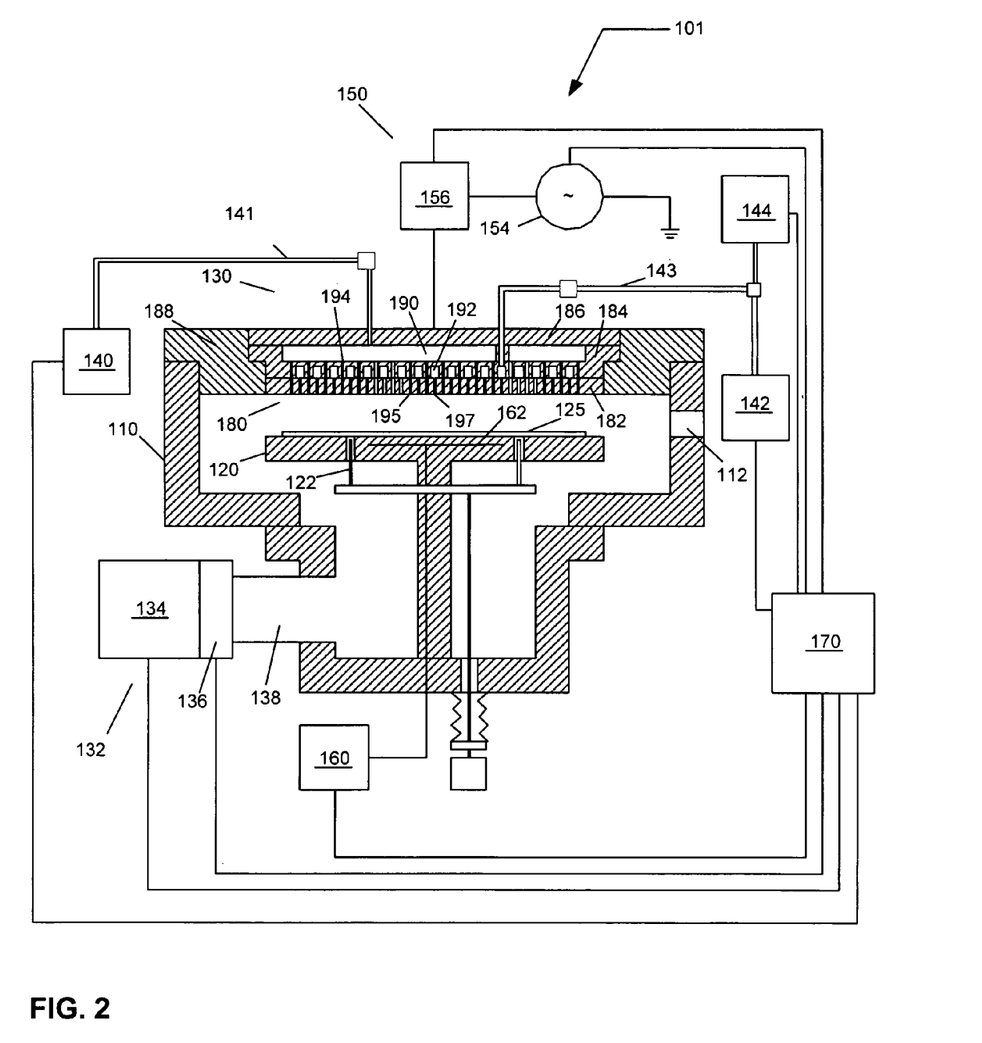
FIG. 2 depicts a schematic view of a deposition system.

Referring now to FIG. 2, a deposition system 101 is depicted. The deposition system 101 comprises a process chamber 110 having a substrate holder 120 configured to support a substrate 125, upon which the thin film is formed. The process chamber 110 further comprises an upper assembly 130 coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120 and configured to elevate and control the temperature of substrate 125. Additionally, deposition system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1 above.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternatingly introduce a first process material to process chamber 110 and a second process material to process chamber 110. The alternation of the introduction of the first material and the introduction of the second material can be cyclical, or it may be acyclical with variable time periods between introduction of the first and second materials. The first process material can, for example, comprise a film precursor, such as a composition having the principal atomic or molecular species found in the film formed on substrate 125. For instance, the film precursor can originate as a solid phase, a liquid phase, or a gaseous phase, and it may be delivered to process chamber 110 in a gaseous phase, and with or without a carrier gas. The second process material can, for example, comprises a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

The first process material and the second process material are chosen in accordance with the composition and characteristics of a material to be deposited on the substrate. The first process material can comprise a tantalum containing material, a tungsten containing material, a titanium containing material, a copper containing material, an aluminum containing material, a gallium containing material, a hafnium containing material, a molybdenum containing material, a zirconium containing material, or a silicon containing material. Furthermore, for instance, the first process material can include a metal halide, metal carbonyl, or a metal organic material. The second process material can include a reducing agent.

In one example, when depositing tantalum (Ta), tantalum nitride, or tantalum carbonitride, the first process material can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$ (hereinafter referred to as TAIMATA®; for additional details, see U.S. Pat. No. 6,593,484), or $Ta(NC(CH_3)_3)(N(CH_3)_2)_3$, and the second process material can include $H_2$, $NH_3$, $N_2$ and $H_2$, $N_2H_4$, $NH(CH_3)_2$, $N_2H_3CH_3$, silane ($SiH_4$), or disilane ($Si_2H_6$), or a combination thereof.

In another example, when depositing titanium (Ti), titanium nitride, or titanium carbonitride, the first process material can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and the second process material can include $H_2$, $NH_3$, $N_2$ and $H_2$, $N_2H_4$, $NH(CH_3)_2$, or $N_2H_3CH_3$.

As another example, when depositing tungsten (W), tungsten nitride, or tungsten carbonitride, the first process material can include $WF_6$, or $W(CO)_6$, and the second process material can include $H_2$, $NH_3$, $N_2$ and $H_2$, $N_2H_4$, $NH(CH_3)_2$, or $N_2H_3CH_3$.

In another example, when depositing molybdenum (Mo), the first process material can include molybdenum hexafluoride ($MoF_6$), and the second process material can include $H_2$.

When depositing copper, the first process material can include organometallic compounds, such as Cu(TMVS) (hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The second process material can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example, when depositing $ZrO_2$, the first process material can include $Zr(NO_3)_4$, or $ZrCl_4$, and the second process material can include $H_2O$.

When depositing $HfO_2$, the first process material can include $Hf(OBu^t)_4$, $Hf(NO_3)_4$, or $HfCl_4$, and the second process material can include $H_2O$. In another example, when depositing hafnium (Hf), the first process material can include $HfCl_4$, and the second process material can include $H_2$.

In still another example, when depositing niobium (Nb), the first process material can include niobium pentachloride ($NbCl_5$), and the second process material can include $H_2$.

In another example, when depositing zinc (Zn), the first process material can include zinc dichloride ($ZnCl_2$), and the second process material can include $H_2$.

In another example, when depositing $SiO_2$, the first process material can include $Si(OC_2H_5)_4$, $SiH_2Cl_2$, $SiCl_4$, or $Si(NO_3)_4$, and the second process material can include $H_2O$ or $O_2$. In another example, when depositing silicon nitride, the first process material can include $SiCl_4$, or $SiH_2Cl_2$, and the second process material can include $NH_3$, or $N_2$ and $H_2$. In another example, when depositing TiN, the first process material can include titanium nitrate ($Ti(NO_3)$), and the second process material can include $NH_3$.

In another example, when depositing aluminum, the first process material can include aluminum chloride ($Al_2Cl_6$), or trimethylaluminum ($Al(CH_3)_3$), and the second process material can include $H_2$. When depositing aluminum nitride, the first process material can include aluminum trichloride, or trimethylaluminum, and the second process material can include $NH_3$, or $N_2$ and $H_2$. In another example, when depositing aluminum oxide, the first process material can include aluminum chloride, or trimethylaluminum, and the second process material can include $H_2O$, or $O_2$ and $H_2$.

In another example, when depositing GaN, the first process material can include gallium nitrate ($Ga(NO_3)_3$), or trimethylgallium ($Ga(CH_3)_3$), and the second process material can include $NH_3$.

Additionally, the purge gas supply system 144 can be configured to introduce a purge gas to process chamber 110. For example, the introduction of purge gas may occur between introduction of the first process material and the second process material to process chamber 110, or following the introduction of the second process material to process chamber 110, respectively. The purge gas can comprise an inert gas, such as a Noble gas (i.e., helium, neon, argon, xenon, krypton), or nitrogen, or hydrogen.

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1, the flow control devices can include pneumatic driven valves, electromechanical (solenoidal) valves, and/or high-rate pulsed gas injection valves. An exemplary pulsed gas injection system is described in greater detail in pending U.S. application 60/272,452, filed on Mar. 2, 2001, which is incorporated herein by reference in its entirety.

Referring still to FIG. 2, the first process material is coupled to process chamber 110 through first material line 141, and the second process material is coupled to process chamber 110 through second material line 143. Additionally, the purge gas may be coupled to process chamber 110 through the first material line 141 (as shown), the second material line 143 (as shown), or an independent line, or any combination thereof. In the embodiment of FIG. 2, the first process material, second process material, and purge gas are introduced and distributed within process chamber 110 through the upper assembly 130 that includes gas injection assembly 180. While not shown in FIG. 2, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188. The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184.

Referring still to FIG. 2, the deposition system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both in process chamber 110. The first power source 150 may be variable and includes a radio frequency (RF) generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

Still referring to FIG. 2, deposition system 101 comprises substrate temperature control system 160 coupled to the substrate holder 120 and configured to elevate and control the temperature of substrate 125. Substrate temperature control system 160 comprises at least one temperature control element, including a resistive heating element such as an aluminum nitride heater, a metal heater (e.g., aluminum heater), a SUS heater, or a hastelloy heater. The substrate temperature control system 160 can, for example, be configured to elevate and control the substrate temperature up to from approximately 350° C. to 400° C. Alternatively, the substrate temperature can, for example, range from approximately 150° C. to 350° C. It is to be understood, however, that the temperature of the substrate is selected based on the desired temperature for causing ALD deposition of a particular material on the surface of a given substrate. Therefore, the temperature can be higher or lower than described above.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials.

Figure 3:
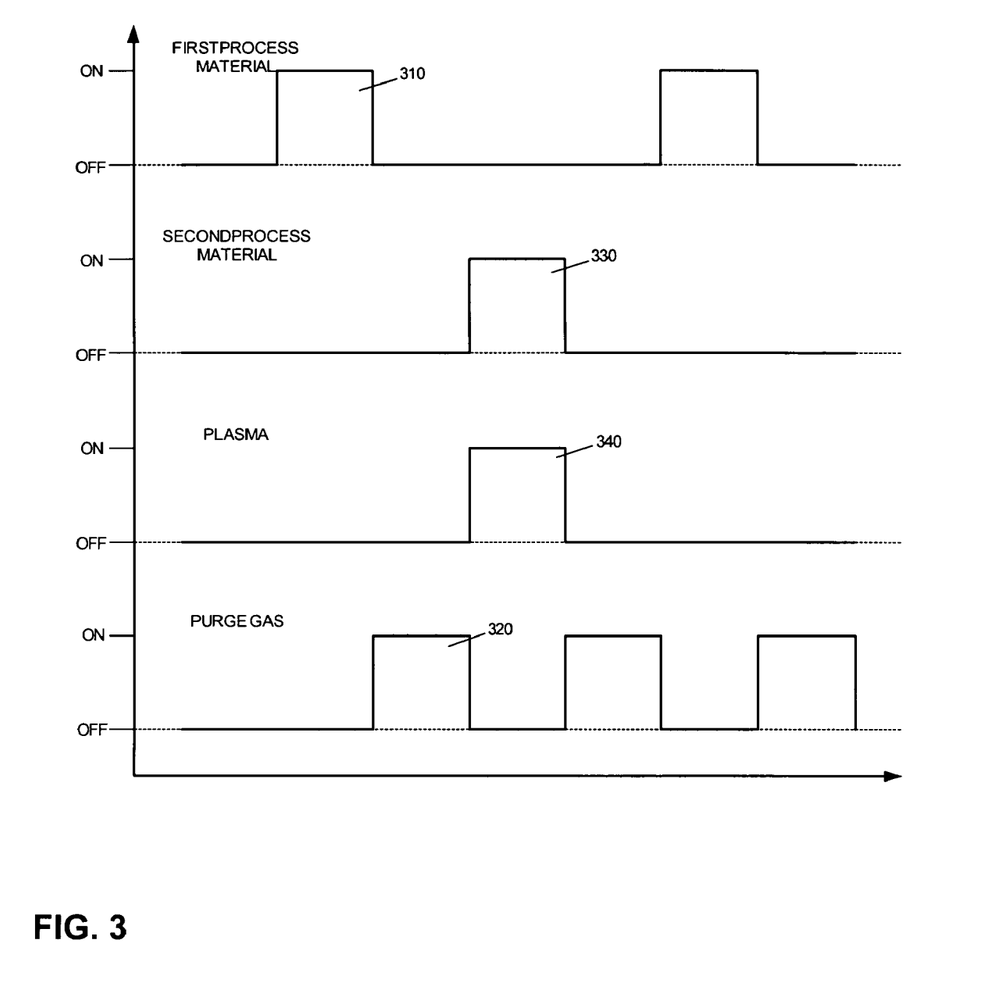
FIG. 3 is a timing diagram for a PEALD process.

Referring now to FIG. 3, deposition system 1/101 (denoted by FIG. 1/FIG. 2 reference numeral) can be configured to perform a plasma enhanced atomic layer deposition (PEALD) process according to an embodiment of the present invention. FIG. 3 is a timing diagram for an exemplary PEALD process in accordance with an exemplary embodiment of the present invention. As seen in this figure, a first process material is introduced to process chamber 10/110 for a first period of time 310 in order to cause adsorption of the film precursor (first process material) on exposed surfaces of substrate 25/125, then the process chamber 10/110 is purged with a purge gas for a second period of time 320. Thereafter, a reducing agent (second process material), is introduced to process chamber 10/110 for a third period of time 330 while power is coupled through the upper assembly 30/130 from the first power source 50/150 to the reducing agent as shown by 340. The coupling of power to the reducing agent heats the reducing agent, thus causing ionization and/or dissociation of the reducing agent in order to form a radical that chemically reacts with the first precursor adsorbed on substrate 25/125.

When substrate 25/125 is heated to an elevated temperature, the surface chemical reaction facilitates the formation of the desired film. The process chamber 10/110 is purged with a purge gas for a fourth period of time. The introduction of the first and second process materials, and the formation of plasma can be repeated any number of times to produce a film of desired thickness on the substrate.

As shown in FIG. 3, the PEALD process proceeds through a cycle by introducing a film precursor to the PEALD processing system during a first step, followed by purging the PEALD processing system. Thereafter, a reduction gas is introduced to the PEALD processing system and plasma is formed by coupling power to the reduction gas during a second step, followed by another purging of the PEALD processing system. The present inventor has observed that there exist at least two regimes within which films can be grown using PEALD processes.

Figure 4A:
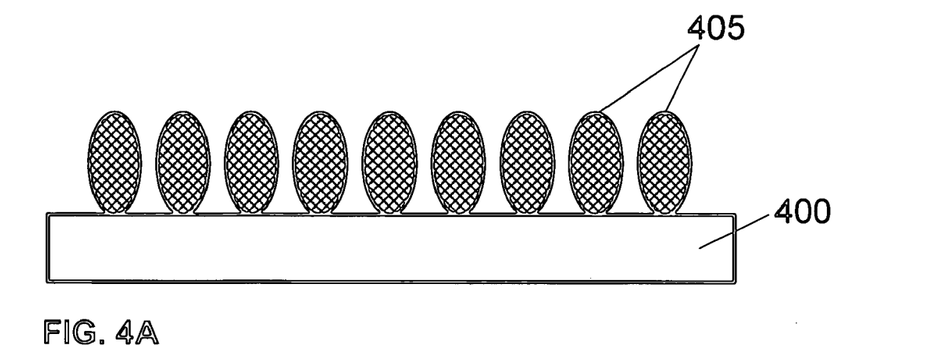
FIGS. 4A through 4F illustrate an exemplary method of depositing a thin film using a PEALD process.
Figure 4B:
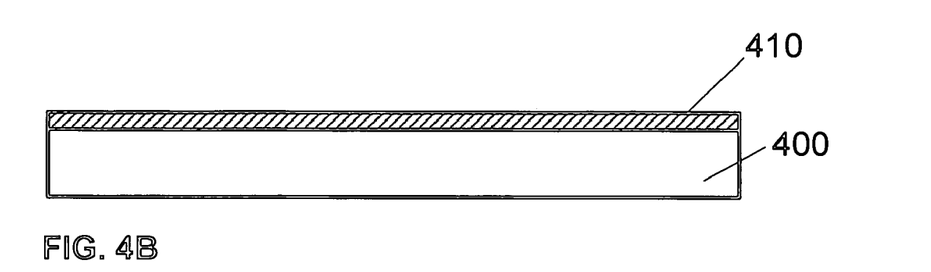
Figure 4C:
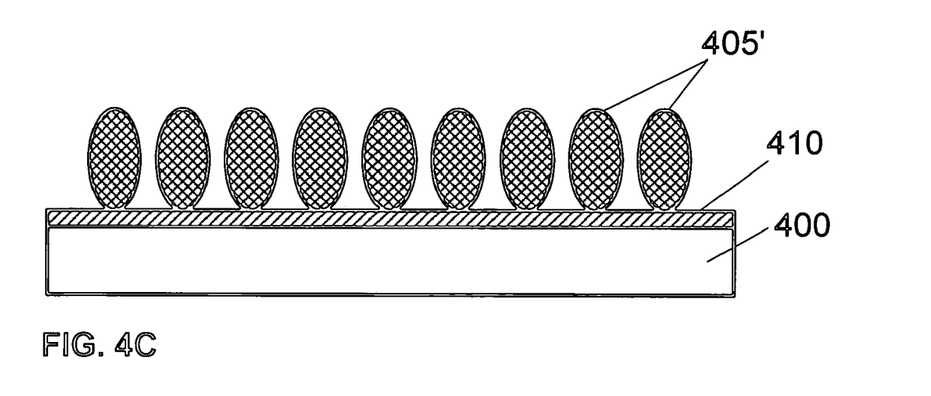
Figure 4D:
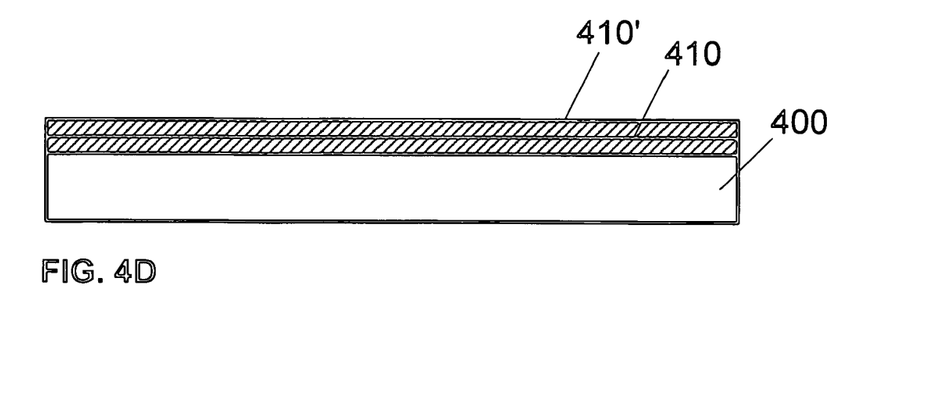
Figure 4E:
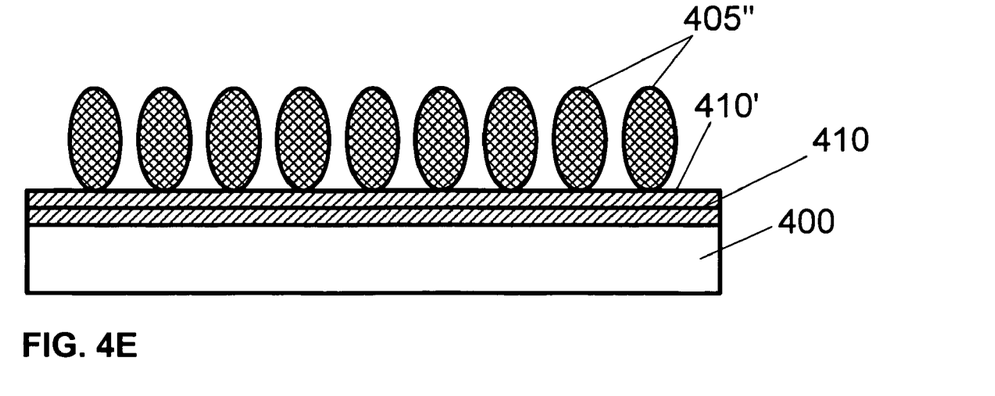
Figure 4F:
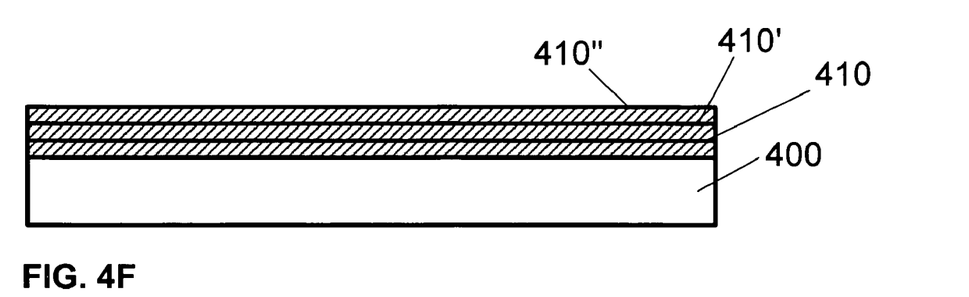

FIGS. 4A through 4F illustrate film growth in a first regime for a PEALD process utilizing a low power setting during the second step (i.e., a power less than approximately 1000 W). For example, in FIG. 4A, substrate 400 is exposed to a film precursor 405 during the first step of the PEALD cycle, and some of the film precursor 405 adsorbs on the exposed surface of substrate 400. In FIG. 4B, substrate 400 is exposed to a reduction (gas) plasma during the second step of the PEALD process, and the adsorbed film precursor 405 is reduced to form layer 410. Thereafter, in FIGS. 4C and 4D, substrate 400 (with layer 410) is exposed to a second PEALD process cycle including exposure of substrate 400 to a film precursor 405' and exposure of substrate 400 to a reduction plasma to form another layer 410'. Again, in FIGS. 4E and 4F, substrate 400 (with layers 410 and 410') is exposed to a third PEALD process cycle including exposure of substrate 400 to a film precursor 405" and exposure of substrate 400 to a reduction plasma to form another layer 410". With each successive PEALD process cycle, another layer is formed, and a PEALD film is grown.

Figure 5A:
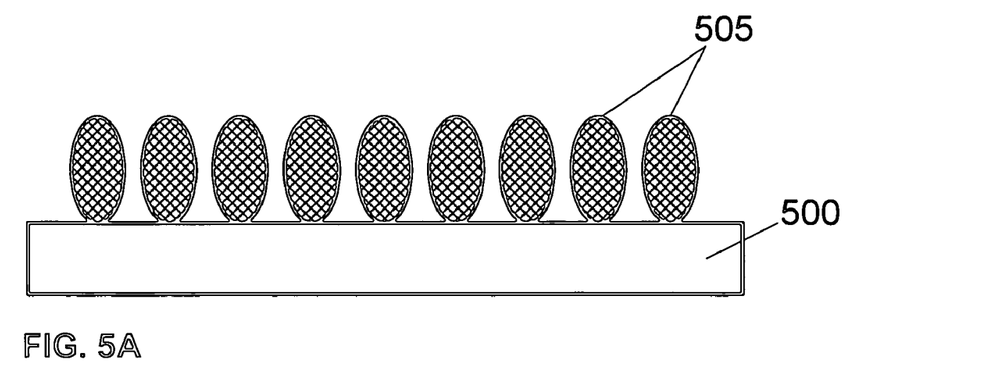
FIGS. 5A through 5F illustrate another exemplary method of depositing a thin film using a PEALD process.
Figure 5B:
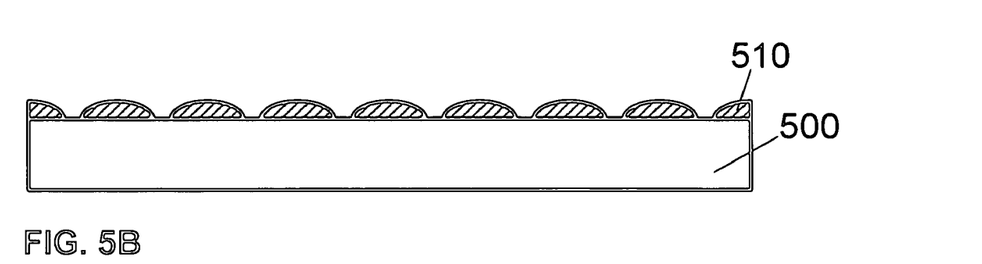

FIGS. 5A through 5F illustrate film growth in a second regime for a PEALD process utilizing a high power setting during the second step (i.e., a power greater than approximately 1000 W). For example, in FIG. 5A, substrate 500 is exposed to a film precursor 505 during the first step of the PEALD cycle, and some of the film precursor 505 adsorbs on the exposed surface of substrate 500. In FIG. 5B, substrate 500 is exposed to a reduction (gas) plasma during the second step of the PEALD process, and the adsorbed film precursor 505 is reduced to form an incomplete layer 510 (or "island" layer).

Figure 5C:
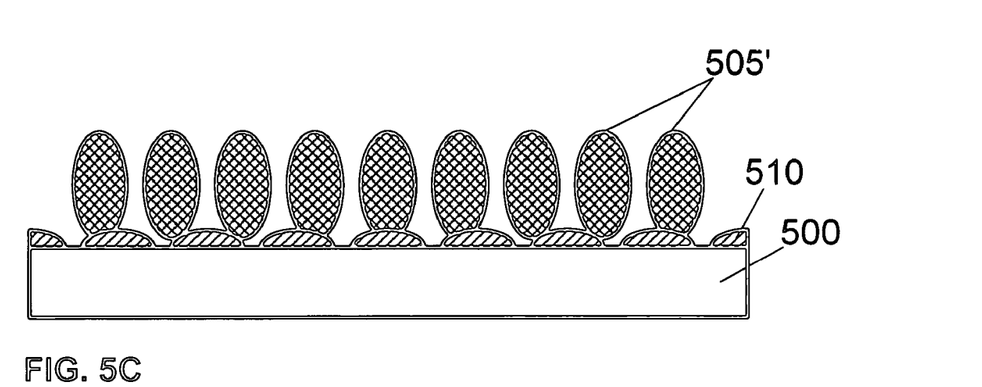
Figure 5D:
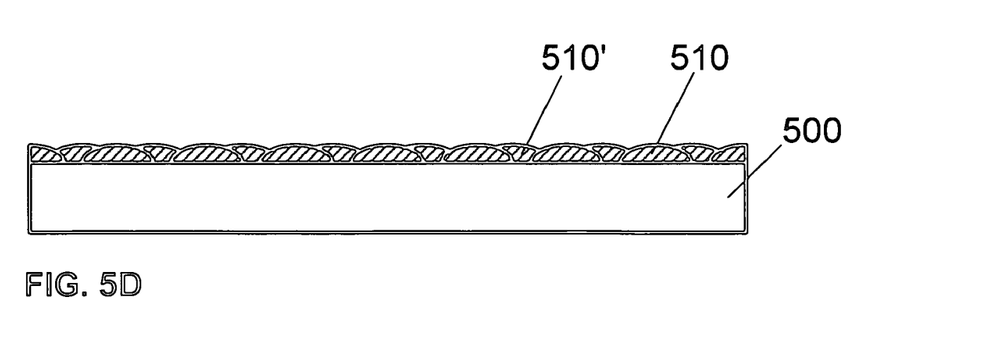
Figure 5E:
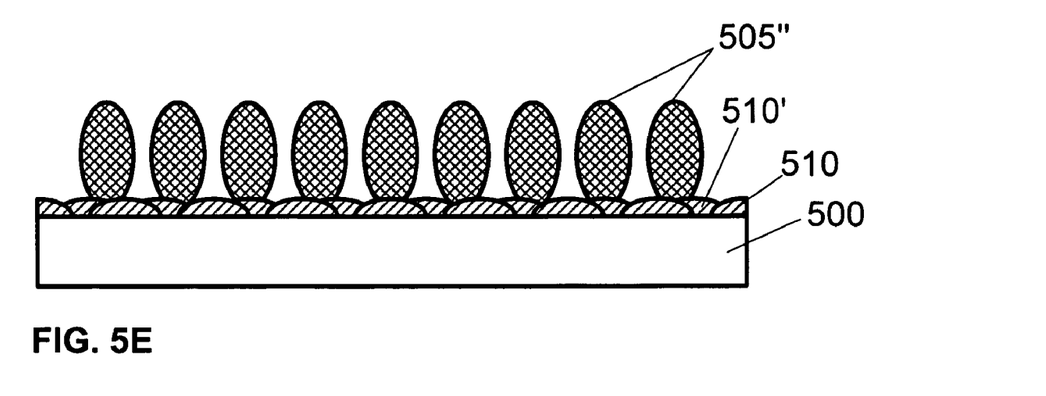
Figure 5F:
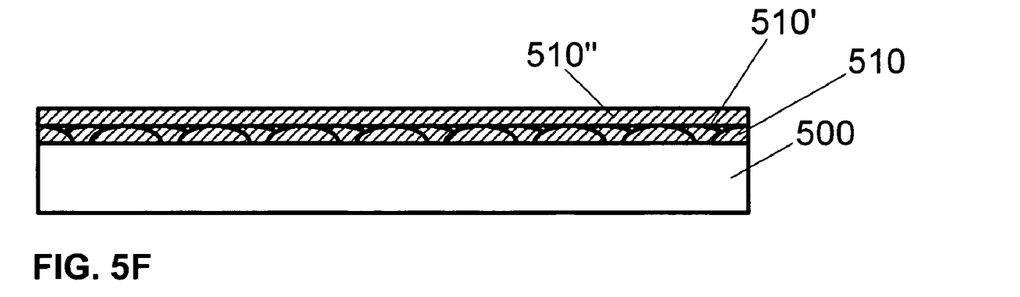

Thereafter, in FIGS. 5C and 5D, substrate 500 (with layer 510) is exposed to a second PEALD process cycle including exposure of substrate 500 to a film precursor 505' and exposure of substrate 500 to a reduction plasma to form another incomplete layer 510'. However, in FIGS. 5E and 5F, substrate 500 (with layers 510 and 510') is exposed to a third PEALD process cycle including exposure of substrate 500 to a film precursor 505" and exposure of substrate 500 to a reduction plasma to form a complete layer 510". With each successive PEALD process cycle, another layer is formed, and a PEALD film is grown. Although the transition from "island" film growth to layer-by-layer film growth is shown to occur between the second and third PEALD process cycles, this transition may occur at a later PEALD process cycle. FIGS. 4A through 4F, and FIGS. 5A through 5F are for purposes of illustration and not to be limited in scope.

Unlike the low power PEALD process depicted in FIGS. 4A through 4F wherein layer-by-layer film growth is demonstrated and closure of the substrate surface occurs in the early cycles of a PEALD film growth, the high power PEALD process of FIGS. 5A through 5F demonstrates a delay in the closure of the substrate surface to later PEALD process cycles and the formation of grain boundaries. Based on this recognition of two PEALD growth regimes, the present inventor discovered that the power level in a PEALD process can be varied to improve the properties of an ALD film.

In one example, a low power PEALD process and a high power PEALD process is performed for depositing a TaCN film from a metal organic film precursor, such as TAIMATA®. In the low power PEALD process, a power setting of 500 W is coupled to an upper assembly 30/130 (as shown in FIGS. 1 and 2) from a power source 50/150 (as shown in FIGS. 1 and 2). In the high power PEALD process, a power setting of 2000 W is coupled to an upper assembly 30/130 (as shown in FIGS. 1 and 2) from a power source 50/150 (as shown in FIGS. 1 and 2). Table 1 presents the remaining parameters set for each PEALD process. The row labeled "TAIMATA" represents the first step (or introduction of film precursor), and the row labeled "$H_2$" represents the second step (or introduction of a reduction gas and formation of a reduction plasma). The process parameters include: mass flow rate of TAIMATA (mg/min, milligrams/minute); flow rate of argon (Ar) carrier gas (sccm, standard cubic centimeters per minute); flow rate of hydrogen ($H_2$) (sccm); flow rate of argon (independent of film precursor and carrier gas) (sccm); the time of the respective step or purge step (sec, seconds); the RF (radio frequency) power (W, watts) coupled to the reduction gas; the chamber pressure (Torr); and the setting for the auto pressure controller (APC) ("hold" represents fixed angular position for butterfly vacuum valve).

TABLE 1

|  | TAIMATA [mg/min] | Carrier Ar [sccm] | $H_2$ [sccm] | Ar10 [sccm] | Time [sec] | Power [W] | Press. [Torr] | APC [deg] |
| --- | --- | --- | --- | --- | --- | --- | --- | --- |
| TAIMATA | 90 | 200 | 0 | 500 | 5 |  |  | Hold |
| Purge | 0 | 0 | 2000 | 0 | 3 |  |  | Hold |
| $H_2$ | 0 | 0 | 2000 | 0 | 20 | 500/2000 | 0.4 |  |
| Purge | 0 | 0 | 0 | 0 | 3 |  |  | Hold |

Figure 6:
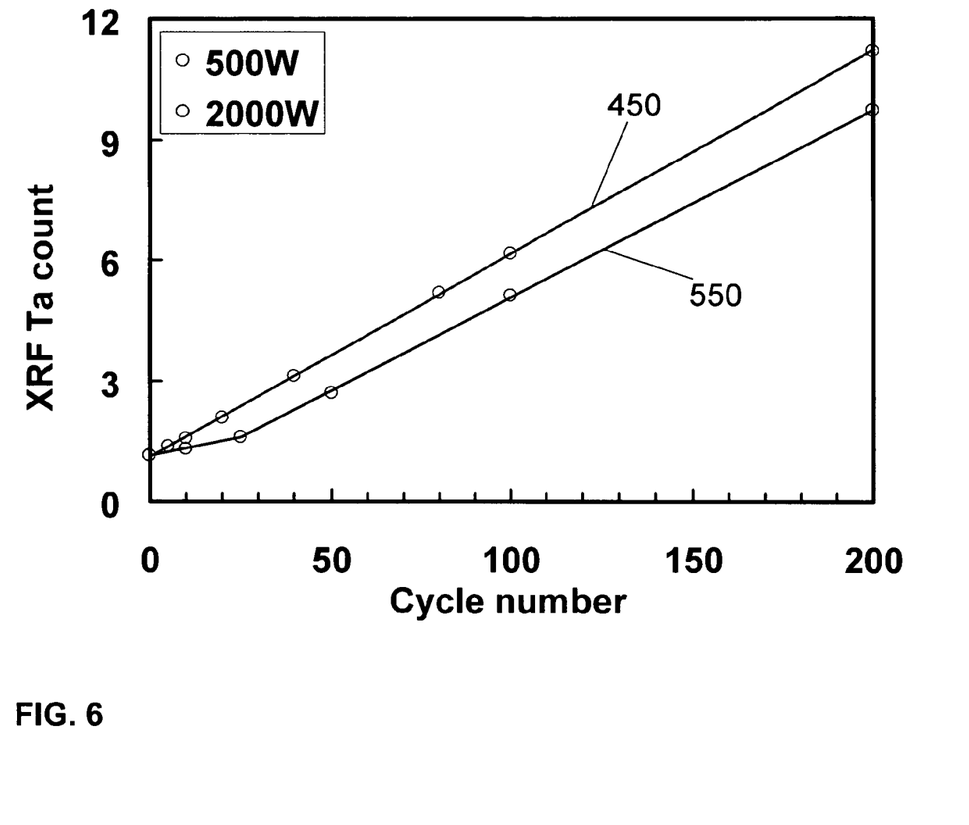
FIG. 6 presents exemplary PEALD process data.

Referring now to FIG. 6, the amount of tantalum (indicated as XRF Ta count) that is accumulated during each cycle (indicated as cycle number) is presented for the low power PEALD process (i.e., 500 W) (denoted as "450" in FIG. 6) and the high power process (i.e., 2000 W) (denoted as "550" in FIG. 6). The amount of tantalum present in a layer is determined using x-ray fluorescence (XRF), and it presented as a count number in FIG. 6. As shown in FIG. 6, the data for the low power PEALD process exhibits an approximately constant slope as a function of cycle number. Conversely, for the high power PEALD process, the data exhibits a first slope, which is less than the slope of the data for the low power PEALD process, and a second slope, which is approximately equivalent to the slope of the low power PEALD process. In the low power PEALD process, the approximately constant slope may characterize a layer-by-layer film growth, as described above with reference to FIGS. 4A through 4F. In the high power PEALD process, the change in slope (from a first slope to a second slope) may characterize the change from "island" film growth to layer-by-layer growth on or about approximately 25 cycles.

Figure 7:
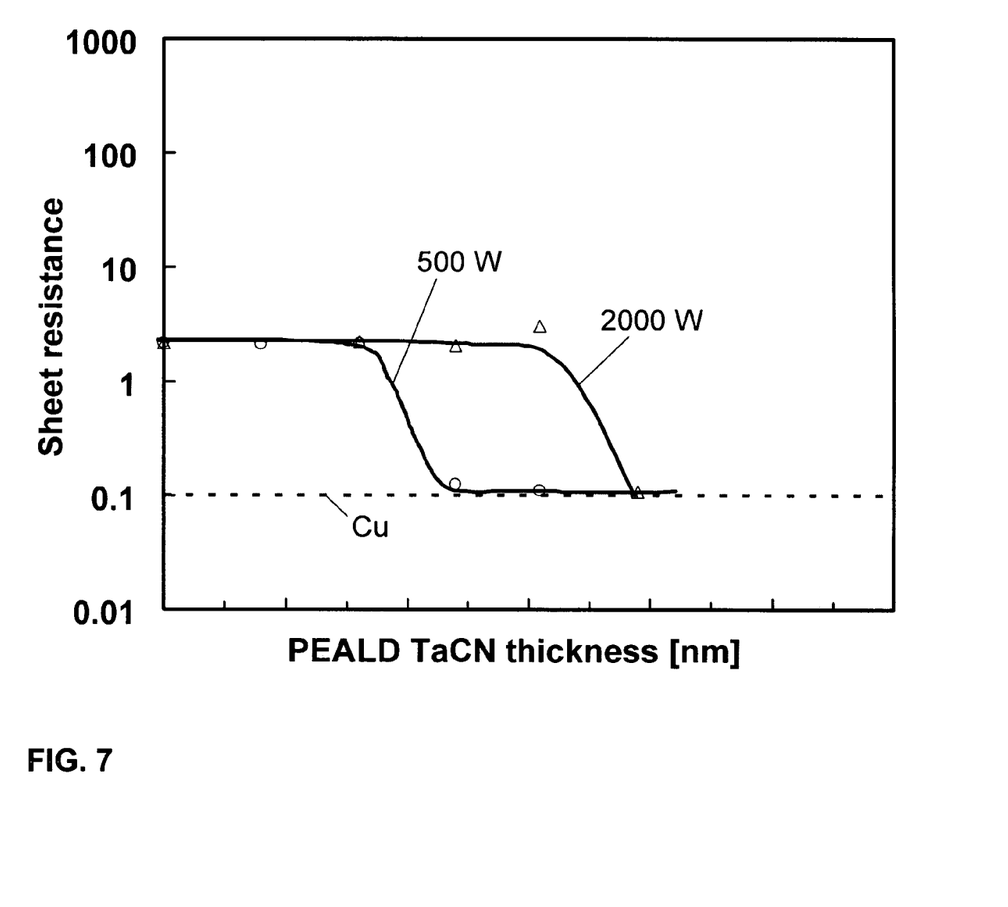
FIG. 7 presents additional exemplary PEALD process data.

Referring now to FIG. 7, the sheet resistance (ohms per square) of a copper (Cu)/TaCN film stack is presented as a function of PEALD TaCN thickness (nm, nanometers) for the low power PEALD process (i.e., 500 W), the high power PEALD process (i.e., 2000 W), and for a film stack comprising copper alone. The film stack is prepared on a silicon substrate, wherein the film stack comprises 180 nm of ionized physical vapor deposition (i-PVD) copper overlying a TaCN film of thickness specified in FIG. 7. The minimum thickness of the TaCN film (to avoid copper diffusion) increases from approximately 2.3 nm (where the sheet resistance of the film stack meets that of copper alone) for the low power PEALD process to approximately 3.8 nm for the high power PEALD process. Therefore, the low power process demonstrates an improved barrier property (as observed in the sheet resistance measurement). In particular, the low power process provides adequate barrier characteristics in a thinner film. This observation can be attributed to the "island" film growth observed during the initial stages of the film growth with a high power process, and the evolution of grain boundaries which cause poor barrier properties.

However, the present inventor recognized that films deposited using only a low power PEALD process take a long time to deposit, and therefore decrease manufacturing throughput. Therefore, in one aspect of the present invention, a low power ALD process is first used to form a high quality film at the interface of the substrate, and the film is then completed using a high power process having a shorter ALD cycle time.

Figure 8:
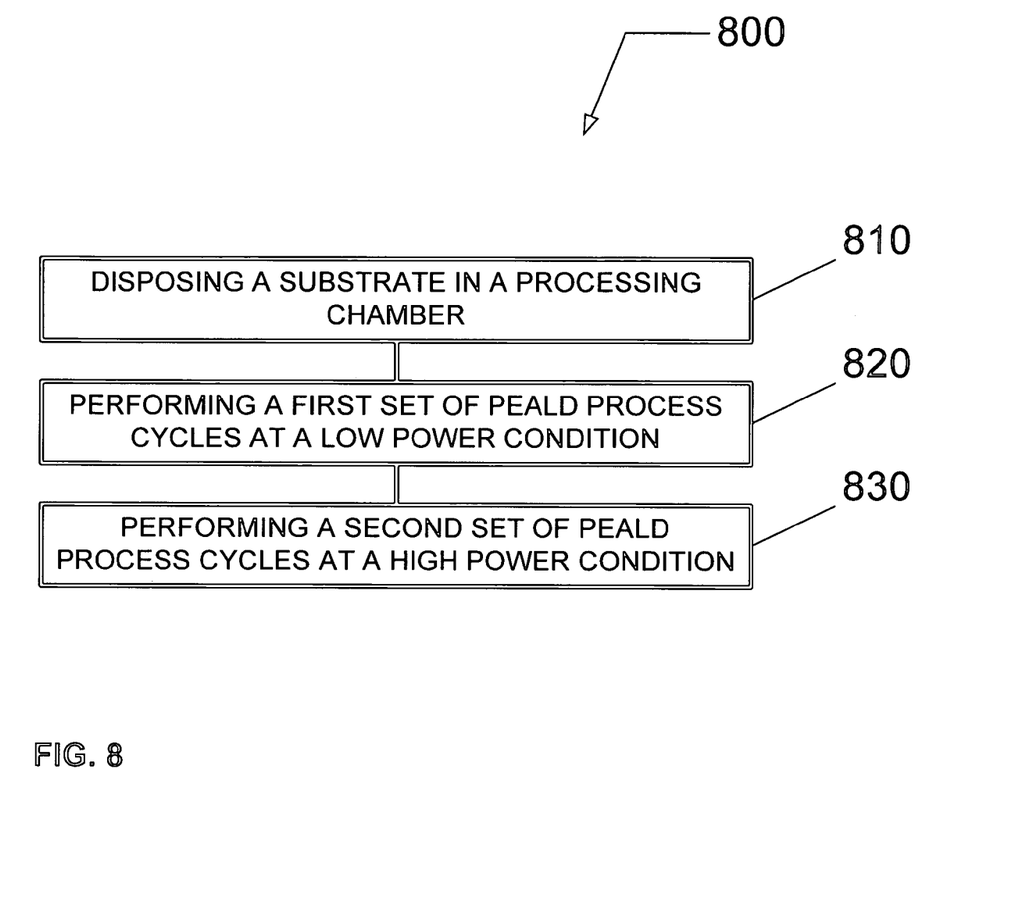
FIG. 8 presents a method of depositing a thin film using a PEALD process according to an embodiment of the invention.

FIG. 8 presents a method of depositing a thin film using a PEALD process according to one embodiment. The method comprises flow chart 800 beginning in 810 with disposing the substrate in a processing chamber configured to facilitate the PEALD process. The processing chamber can, for example, include a processing chamber as described in FIG. 1 or 2.

In 820, a first set of one or more PEALD process cycles is performed in the processing chamber. The first set of PEALD process cycles comprises setting an electromagnetic power to a low power condition in order to facilitate growth of the thin film during the early stages of film growth. While step 820 typically includes a plurality of PEALD process cycles, it may be desirable to perform only one PEALD cycle at relatively low power which is included in the present invention. Each PEALD process cycle can, for instance, comprise: introducing a first process material, such as a film precursor, within the processing chamber; introducing a second process material, such as a reduction agent, within the processing chamber; and coupling electromagnetic power of less than approximately 1000 W to the processing chamber during introduction of the second process material. The electromagnetic power for the low power condition can, for example, be approximately 500 W. The first set of PEALD process cycles can, for example, include a number of cycles ranging from approximately 1 cycle to approximately 1000 cycles. Alternatively, the number of cycles can range from approximately 1 cycle to approximately 500 cycles, or desirably it can range from approximately 1 cycle to approximately 100 cycles. By way of further example, the number of cycles can range from approximately 1 cycle to approximately 50 cycles, or desirably it can range from approximately 10 cycles to approximately 40 cycles.

In 830, a second set of PEALD process cycles is performed in the processing chamber. The second set of PEALD process cycles comprises setting an electromagnetic power to a high power condition in order to facilitate layer-by-layer growth of the thin film during the latter stages of film growth and accelerate film growth. Each PEALD process cycle can, for instance, comprise: introducing the first process material, such as a film precursor, within the processing chamber; introducing the second process material, such as a reduction agent, within the processing chamber; and coupling electromagnetic power of greater than approximately 1000 W to the processing chamber during introduction of the second process material. The electromagnetic power for the high power condition can, for example, be approximately 2000 W.

According to one embodiment, film growth by the first PEALD cycles at relatively low power is monitored to determine whether power may be increased to provide more rapid film growth. This monitoring is preferably done by monitoring whether a predetermined number of cycles have been performed, but may be done by direct monitoring of film thickness for example. The predetermined number of cycles corresponds to a point where high power film growth substantially changes from "island" film growth to layer-by-layer growth, as described above with respect to FIGS. 4 through 7. It is to be understood that the predetermined number of cycles may change based on the film being deposited, the process parameters such as power and/or the desired film characterisitcs. A suitable number of first PEALD cycles at relatively low power may be determined by direct experimentation and/or design of experiments (DOE). Other adjustable process parameters such as substrate temperature, process pressure, type of process gas and relative gas flows can also be determined by direct experimentation and/or design of experiments (DOE). In addition, film growth by the second PEALD cycles at relatively high power may monitored to determine whether a desired film thickness has been achieved.

Although only certain exemplary embodiments of inventions have been described in detail above, those skilled in the art will readily appreciate that many modifications are possible in the exemplary embodiments without materially departing from the novel teachings and advantages of this invention. For example, the present inventor discovered that PEALD films formed at high power have a "grain boundary" structure at the substrate interface. Further, the inventors have recognized that this structure is undesirable for barrier layers, and the present invention is described primarily in the context of a barrier layer. It is to be understood, however, that metal containing layers having a homogeneous structure are also desirable for other PEALD films such as a seed layer or gate film, for example. Thus, the present invention may be implemented for any PEALD film where a grain boundary structure is intended to be avoided. Moreover, the present inventors recognize that there may be limited situations where a grain boundary structure could actually be beneficial to a device. For example, an adhesion layer having a grain boundary structure may provide a better surface than a non-grain boundary structure for subsequently deposited films to adhere to. Thus, in one aspect of the present invention, a thin film can be formed using a high power PEALD process to provide a grain boundary film as the intended structure.

The invention claimed is:

1. A method of depositing a thin film on a substrate using a plasma enhanced atomic layer deposition (PEALD) process, comprising:
   disposing said substrate in a processing chamber configured to facilitate said PEALD process;
   performing a first set of one or more PEALD process cycles, each PEALD process cycle comprising:
      introducing a first process material within said processing chamber;
      introducing a second process material within said processing chamber; and
      coupling electromagnetic power of less than 1000 W to said processing chamber during introduction of said second process material;
   performing a second set of one or more PEALD process cycles, each PEALD process cycle comprising:
      introducing said first process material within said processing chamber;
      introducing said second process material within said processing chamber; and
      coupling electromagnetic power of greater than 1000 W to said processing chamber during introduction of said second process material.

2. The method of claim 1, wherein said introducing said first process material comprises introducing a tantalum containing material, a tungsten containing material, a titanium containing material, a copper containing material, an aluminum containing material, a gallium containing material, a hafnium containing material, a molybdenum containing material, a zirconium containing material, or a silicon containing material.

3. The method of claim 1, wherein said introducing said first process material comprises introducing a metal halide, a metal carbonyl, or a metal organic.

4. The method of claim 1, wherein said introducing said first process material comprises introducing a tantalum containing material including one or more of $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$.

5. The method of claim 1, wherein said introducing a second process material comprises introducing a process material comprising at least one of $H_2$, $N_2$, $O_2$, $H_2O$, $NH_3$, $H_2O_2$, $SiH_4$, or $SiH_6$.

6. The method of claim 1, wherein said coupling electromagnetic power comprises coupling electromagnetic power to at least one of a plasma electrode and a substrate holder of the processing chamber.

7. The method of claim 1, further comprising introducing at least one of said first and second process materials by use of a carrier gas.

8. The method of claim 1, further comprising coupling electromagnetic power to said processing chamber during introduction of the first process material in order to generate a plasma that assists in adsorption or bonding of the first process material to said substrate.

9. The method of claim 1, further comprising introducing a purge gas to said processing chamber between introducing said first process material and introducing said second process material.

10. The method of claim 9, wherein said introducing a purge gas comprises introducing an inert gas to said processing chamber.

11. The method of claim 1, wherein said first set of PEALD process cycles comprises performing a number of cycles ranging from approximately 1 to approximately 1000 cycles.

12. The method of claim 1, wherein said first set of PEALD process cycles comprises performing a number of cycles ranging from approximately 1 to approximately 500 cycles.

13. The method of claim 1, wherein said first set of PEALD process cycles comprises performing a number of cycles ranging from approximately 1 to approximately 100 cycles.

14. The method of claim 1, wherein said first set of PEALD process cycles comprises performing a number of cycles ranging from approximately 1 to approximately 50 cycles.

15. The method of claim 1, wherein said first set of PEALD process cycles comprises performing a number of cycles ranging from approximately 10 to approximately 40 cycles.

16. The method of claim 1, wherein said coupling electromagnetic power of less than 1000 W comprises coupling electromagnetic power of less than 1000 W at a frequency of approximately 27 MHz, and wherein said coupling electromagnetic power of greater than 1000 W comprises coupling electromagnetic power of greater than 1000 W at a frequency of approximately 27 MHz.

17. The method of claim 1, wherein said depositing a thin film on a substrate comprises depositing a copper barrier layer on said substrate.

18. A method of depositing a thin film on a substrate using a plasma enhanced atomic layer deposition (PEALD) process, comprising:
   disposing said substrate in a processing chamber configured to facilitate said PEALD process;
   performing a first set of one or more PEALD process cycles by setting an electromagnetic power to a low power condition in order to facilitate layer-by-layer growth of said thin film during the early stages of film growth; and
   performing a second set of one or more PEALD process cycles by setting an electromagnetic power to a high power condition in order to facilitate layer-by-layer growth of said thin film and accelerate film growth,
   wherein each PEALD process cycle comprises:
      introducing a first process material within said processing chamber;
      introducing a second process material within said processing chamber; and
      coupling electromagnetic power according to a power condition to said processing chamber during introduction of said second process material.

19. The method of claim 18, wherein said setting said electromagnetic power to said low power condition comprises coupling electromagnetic power less than approximately 1000 W to said processing chamber during introduction of said second process material.

20. The method of claim 18, wherein said setting said electromagnetic power to said low power condition comprises coupling electromagnetic power less than approximately 600 W to said processing chamber during introduction of said second process material.

21. The method of claim 18, wherein said setting said electromagnetic power to said high power condition comprises coupling electromagnetic power greater than approximately 1000 W to said processing chamber during introduction of said second process material.

22. The method of claim 18, wherein said setting said electromagnetic power to said high power condition comprises coupling electromagnetic power greater than approximately 1500 W to said processing chamber during introduction of said second process material.

23. The method of claim 18, wherein said coupling electromagnetic power according to a power condition comprises coupling electromagnetic power according to a power condition at a frequency of approximately 27 MHz.

24. The method of claim 18, further comprising:

monitoring a status of said thin film; and changing from said first set of PEALD process cycles to said second set of PEALD process cycles when said monitoring step indicates that further film growth at said high power will be substantially layer-by-layer growth.

25. The method of claim 24, wherein said monitoring comprises:

counting a number of first ALD process cycles; and comparing said number of first ALD process cycles to a predetermined number of first ALD cycles corresponding to a point where further film growth at said high power will be substantially layer-by-layer growth.

26. The method of claim 24, wherein said monitoring comprises monitoring a thickness of the thin film.

* * * * *